(12) United States Patent
Mischitz et al.

(10) Patent No.: US 9,844,134 B2
(45) Date of Patent: Dec. 12, 2017

(54) DEVICE INCLUDING A METALLIZATION LAYER AND METHOD OF MANUFACTURING A DEVICE

(71) Applicant: Infineon Technologies AG, Neubiberg (DE)

(72) Inventors: Martin Mischitz, Wernberg (AT); Markus Heinrici, Viktring (AT); Stefan Schwab, Vienna (AT)

(73) Assignee: Infineon Technologies AG, Neubiberg (DE)

( * ) Notice: Subject to any disclaimer, the term of this patent is extended or adjusted under 35 U.S.C. 154(b) by 191 days.

(21) Appl. No.: 14/608,884

(22) Filed: Jan. 29, 2015

(65) Prior Publication Data

US 2016/0225718 A1    Aug. 4, 2016

(51) Int. Cl.
| | |
|---|---|
| *H05K 1/09* | (2006.01) |
| *H05K 1/11* | (2006.01) |
| *H05K 3/22* | (2006.01) |
| *H01L 23/532* | (2006.01) |
| *H01L 21/288* | (2006.01) |

(52) U.S. Cl.
CPC ............ *H05K 1/09* (2013.01); *H01L 21/288* (2013.01); *H01L 23/53228* (2013.01); *H05K 1/11* (2013.01); *H05K 3/22* (2013.01)

(58) Field of Classification Search
CPC . H05K 1/11; H05K 1/118; H05K 1/09; H05K 1/092; H05K 1/095; H05K 1/097; H05K 3/22

See application file for complete search history.

(56) References Cited

U.S. PATENT DOCUMENTS

| | | | |
|---|---|---|---|
| 2011/0303885 A1* | 12/2011 | Vanheusden | H01B 1/22 |
| | | | 252/513 |
| 2012/0256323 A1 | 10/2012 | Engelhardt et al. | |
| 2015/0310967 A1* | 10/2015 | Spath | H05K 3/4644 |
| | | | 427/125 |

OTHER PUBLICATIONS

Becker, et al., "A Study on the Metal-Organic CVD of Pure Copper Films from Low Cost Copper (II) Dialkylamino-2-propoxides: Tuning the Thermal Properties of the Precursor by Small Variations of the Ligand", Chemical Vapor Deposition 2003, 9, No. 3, 149-156.
Galwey, et al., "Thermal Decomposition of Three Crystalline Modifications of Anhydrous Copper (II) Formate", The Journal of Physical Chemistry, vol. 78, No. 26, 1974, 2664-2670.
Pashchanka, Mikhail, "Template-assisted synthesis and charactersation of quasi-one-dimensional ceramic nanomaterials", Technische Universität Darmstadt, 2010, 1-153.

* cited by examiner

*Primary Examiner* — Jeremy C Norris
(74) *Attorney, Agent, or Firm* — Murphy, Bilak & Homiller, PLLC

(57) ABSTRACT

A device comprises a base element and a metallization layer over the base element. The metallization layer comprises pores and has a varying degree of porosity, the degree of porosity being higher in a portion adjacent to the base element than in a portion remote from the base element.

21 Claims, 10 Drawing Sheets

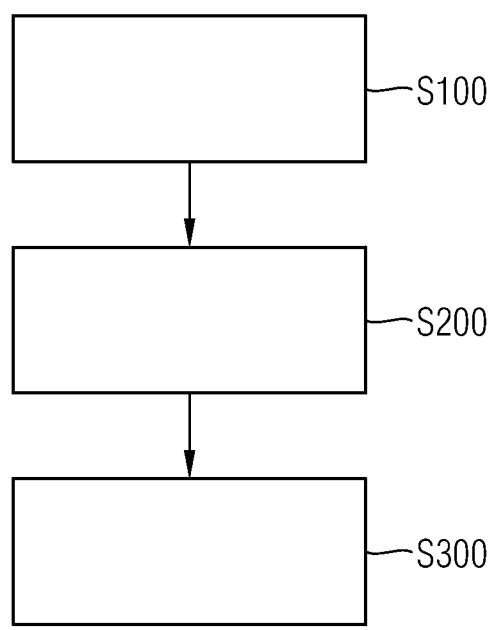

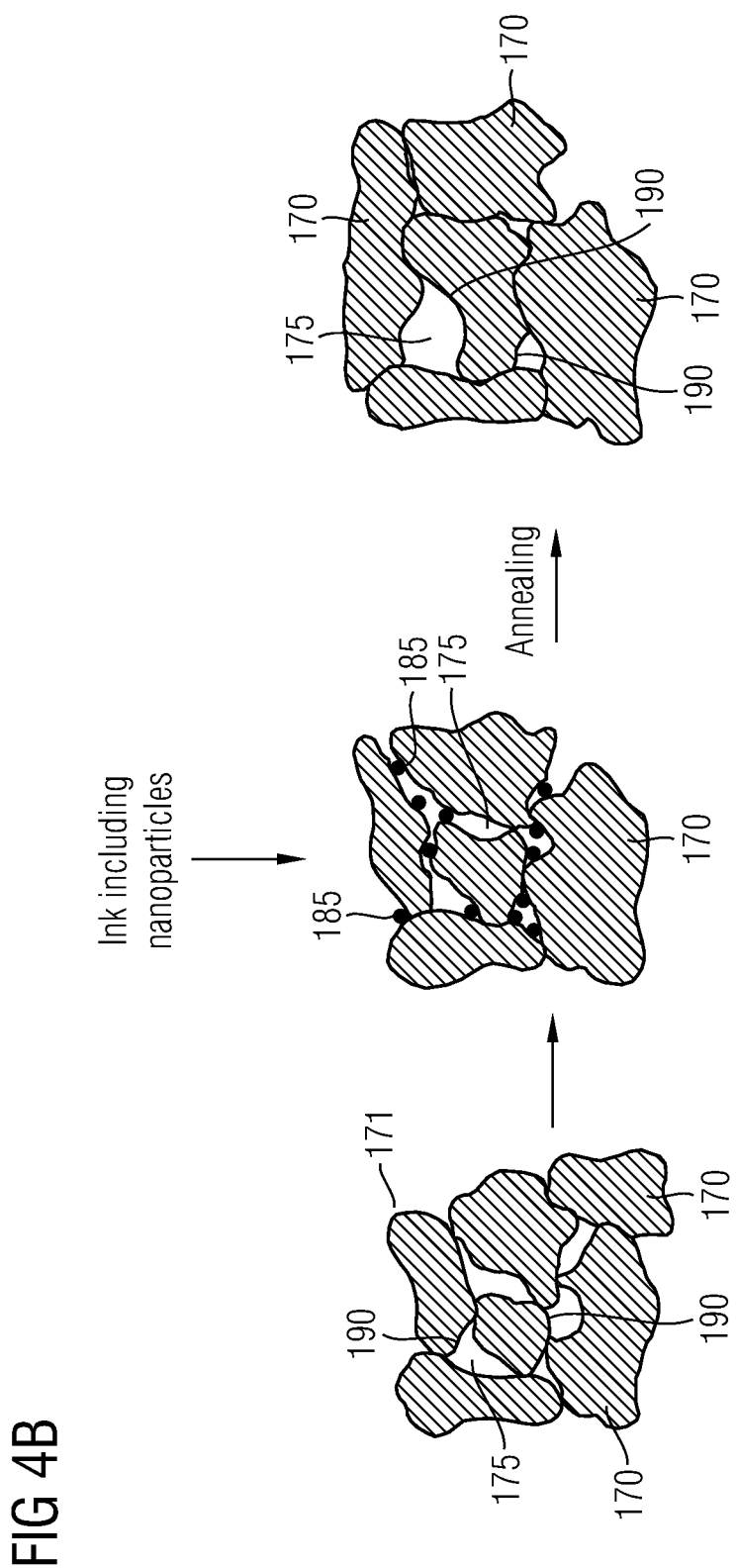

DEVICE INCLUDING A METALLIZATION LAYER AND METHOD OF MANUFACTURING A DEVICE

TECHNICAL BACKGROUND

In the field of metallization layers, e.g., for use in semiconductor devices, for example, power semiconductor devices, metallization layers having a large thickness are employed for conducting large currents and for transferring heat. In particular, due to their large electrical and thermal conductivity, copper metallization layers may conduct heat and current at low losses. The electrical and thermal conductivity is increased by increasing the thickness of a metallization layer. However, due to the different thermal expansion coefficients of a metallization layer with respect to the material of a carrier on which the metallization layer is disposed, delamination of the metallization layer may occur. Further, cracks may form in the metallization layer and additionally, when processing a semiconductor wafer on which a thick metallization layer is arranged, the wafer may bow so that a further processing becomes difficult.

Metallization layers which are based on porous systems have been investigated. It has been shown that these porous metallization layers exhibit a reduced degree of mechanical stress when disposed on a semiconductor substrate. However, these porous systems also have a decreased thermal and electrical conductivity.

Accordingly, further metallization layers having improved properties are investigated.

SUMMARY

According to an embodiment, a device includes a base element, and a metallization layer over the base element, the metallization layer having pores and having a varying degree of porosity. The degree of porosity is higher in a portion adjacent to the base element than in a portion remote from the base element.

According to a further embodiment, a device includes a base element and a porous metallization layer over the base element. The metallization layer includes a metal from the group of copper, silver, nickel and gold and further includes a conductive filling material, wherein a ratio of the conductive filling material with respect to the metal is higher at a portion remote from the base element than at a portion adjacent to the base element.

According to an embodiment, a method of manufacturing a device includes forming a porous metallization layer over a base element, and thereafter, modifying the porous metallization layer, so that the metallization layer has a varying degree of porosity. The degree of porosity is higher in a portion adjacent to the base element than in a portion remote from the base element.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIGS. 4A and 4B illustrate the method of forming a metallization layer according to an embodiment.

DETAILED DESCRIPTION

In the following detailed description reference is made to the accompanying drawings, which form a part hereof and in which are illustrated by way of illustration specific embodiments in which the invention may be practiced. In this regard, directional terminology such as "top," "bottom," "front," "back," "leading," "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer," "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

Figure 1A:
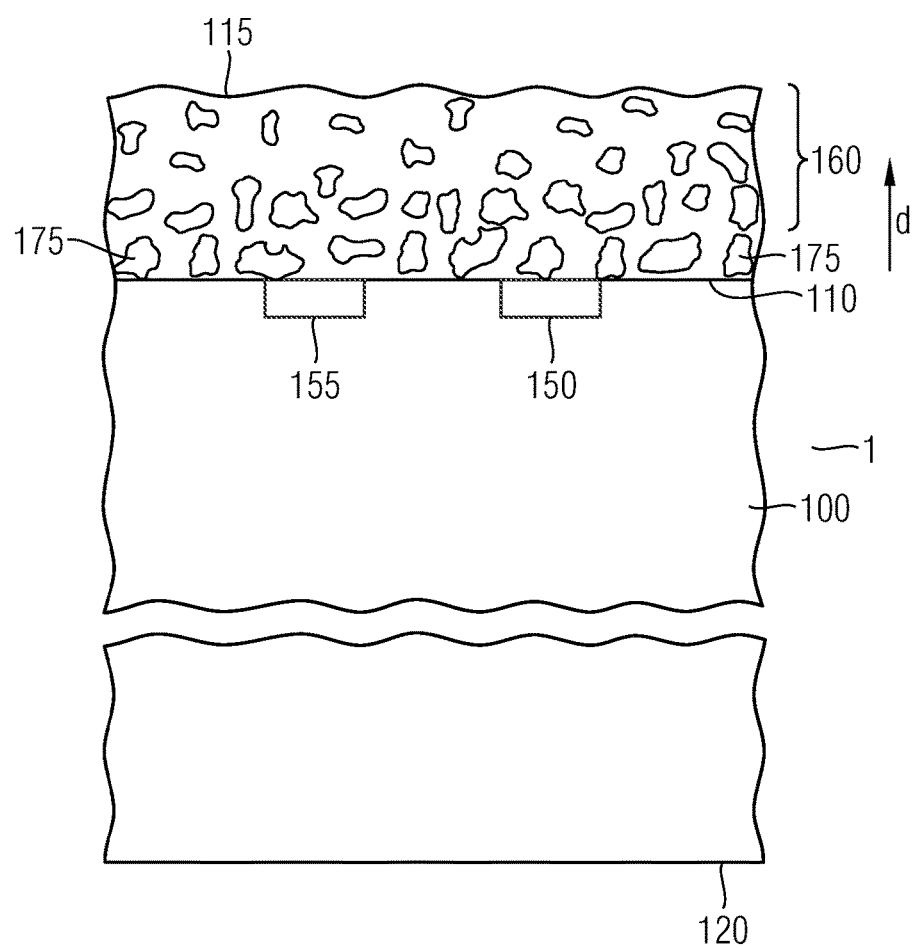
FIG. 1A shows a cross-sectional view of a device according to an embodiment.

FIG. 1A shows a cross-sectional view of a device 1 according to an embodiment. The device 1 shown in FIG. 1A comprises a base element 100 and a metallization layer 160 over the base element 100. The metallization layer 160 comprises pores 175 and has a varying degree of porosity. The degree of porosity is higher in a portion adjacent to the base element 100 than in a portion remote from the base element 100.

The base element 100 may be a semiconductor substrate including device components 155. The base element 100 may further comprise circuit elements 150. For example, the circuit elements 150 and the device components 155 may be components of a semiconductor device, such as doped portions, insulating portions or conductive portions which have a special functionality in the semiconductor device. Examples of the semiconductor device are transistors or transistor-based devices, for example, power semiconductor devices, power MOSFETs, power IGBTs, diodes and others. Further examples of device components 155 are resistors, capacitors, inductors, sensors, energy producing components, energy storing components and conversion elements, for example, photoelectric conversion elements and others. The circuit elements 150 may include any suitable elements for implementing logic circuitry and others. As is clearly to be understood, a plurality of device components 155 or circuit elements 150 may be arranged in the base element. The device components 155 or circuit elements 150 may be electrically coupled to the metallization layer 160. The base element 100 may further comprise a suitable conductive or insulating material. According to further embodiments, the base element 100 may not be a semiconductor but may comprise or consist of an insulator such as glass, or may be a conductive element such as a piece of metal or metal alloy.

The metallization layer 160 is disposed on a main surface 110 of the base element 100. The metallization layer may comprise copper or a copper alloy. According to further embodiments, the metallization layer 160 may comprise silver, nickel or gold or an alloy of any of these materials. The metallization layer 160 may comprise any further metal or metal alloy. The metallization layer 160 comprises pores 175. A degree of porosity is higher in a portion adjacent to the main surface 110 than in a portion adjacent to a main surface 115 of the metallization layer 160. The degree of porosity may be defined as a ratio of the density of the metallization layer in comparison to the density of a bulk metallization layer. For example, if the ratio of the density (i.e. mass/volume) of the porous metallization layer in comparison to the density of the bulk metallization layer is A, the porosity equals to 1-A. As is readily to be appreciated, the degree of porosity is independent from the size of the pores and the distribution of the sizes of the pores. Generally, a size of the pores is approximately several hundred mm to several μm. For example, a thickness of the metallization layer 160 may be more than 3 μm, for example, more than 5 μm and even more, for example, 30 μm and more.

Due to the varying degree of porosity within the metallization layer 160, so that the degree of porosity is higher in a portion adjacent to the base element, mechanical stress may be reduced. In particular, the mechanical stress occurs at the interface between the base element 100 and the metallization layer 160. Accordingly, a high degree of porosity in a region close to the interface reduces the mechanical stress. On the other hand, due to the smaller degree of porosity in a portion remote from the base element 100, the thermal and electrical conductivity of the metallization layer is increased.

For example, generally connection wirings are bonded to the metallization layer at the surface of the metallization layer 115. Due to the decreased degree of porosity, in this region, where a contact to a further metallization wiring is to be made, the electrical conductivity is increased resulting in an improved behavior of the metallization layer.

Figure 1B:
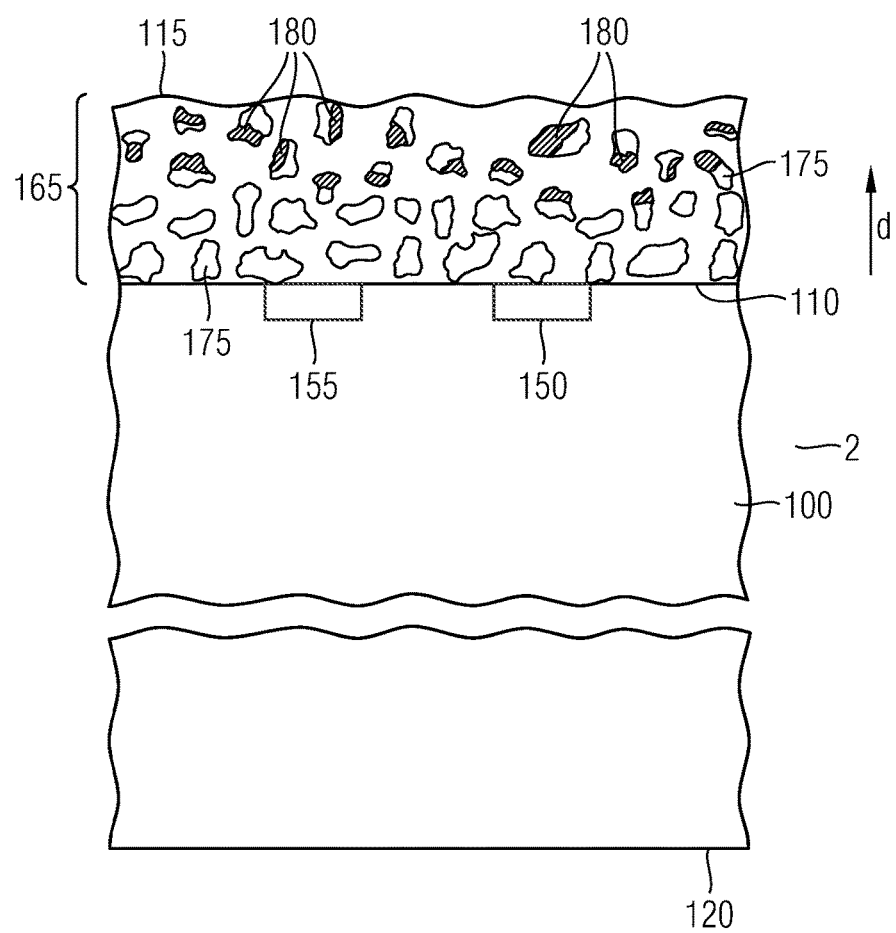
FIG. 1B shows a cross-sectional view of a device, according to a further embodiment.

FIG. 1B shows a device according to a further embodiment. The device 2 of FIG. 1B comprises a base element 100 and a porous metallization layer 165 over the base element 100. The metallization layer 165 comprises a metal and a conductive filling material 180. A ratio of the conductive filling material 180 with respect to the metal is higher at a portion remote from the base element 100 than at a portion adjacent to the base element 100. The metal may be selected from the group of copper, silver, nickel and gold. The metal may also comprise a further metal. For example, the metal may be copper.

In the embodiment of FIG. 1B, the base element 100 may have a similar construction as the base element 100 of FIG. 1A. The content of the conductive filling material 180 with respect to the content of the metal is higher at a side close to the surface 115 of the metallization layer than at a side close to the main surface 110 of the base element. Pores 175 are arranged in the metallization layer 165. The conductive filling material 180 may fill at least some of the pores 175 at least partially. As a result, the degree of porosity of the resulting layer may be larger at a portion close to the interface between the base element 100 and the metallization layer 160 than at a portion close to the main surface 115 of the metallization layer. For example, the conductive filling material may be identical to the metal of the metallization layer 160 or may be a material which is different from the metal of the metallization layer. For example, if the metallization layer comprises copper or a copper alloy, the conductive filling material may comprise silver, zinc, tin, nickel, indium, gold or carbon. The conductive filling material need not be a metal. For example, the conductive filling material may comprise carbon nanotubes or graphene. For example, the conductive filling material 180 may melt or sinter together with a portion of the metal of the metallization layer. In case an alloy forming material such as zinc or tin is employed as the conductive filling material, the metal of the metallization layer may form an alloy with the conductive filling material. The further features of the embodiment of FIG. 1B are similar to the embodiment of FIG. 1A. As is clearly to be understood, a device according to the embodiment of FIG. 1A may also be implemented in the manner described with reference to FIG. 1B, i.e. comprising a conductive filling material 180.

Figure 2A:
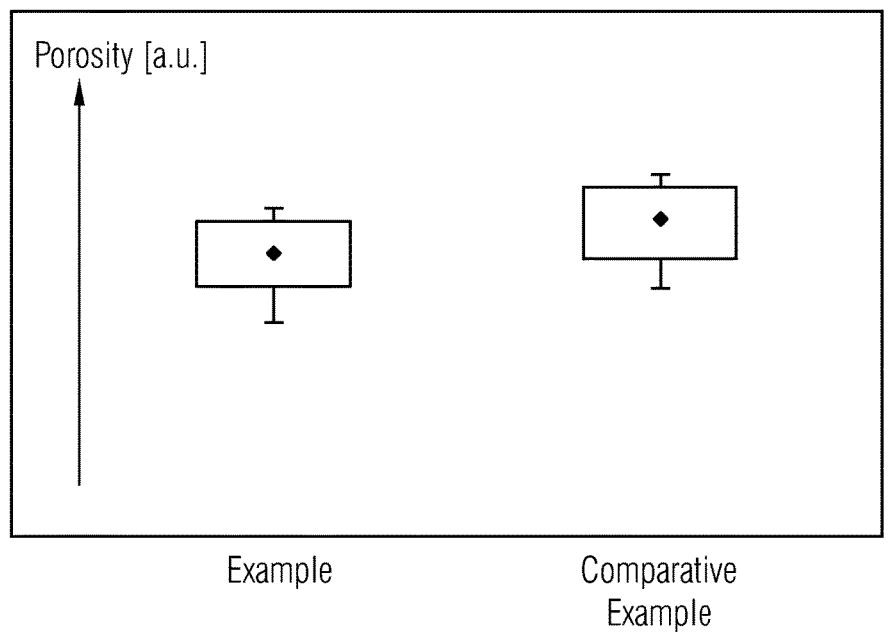
FIG. 2A is a graph illustrating the porosity of an example and a comparative example.
Figure 2B:
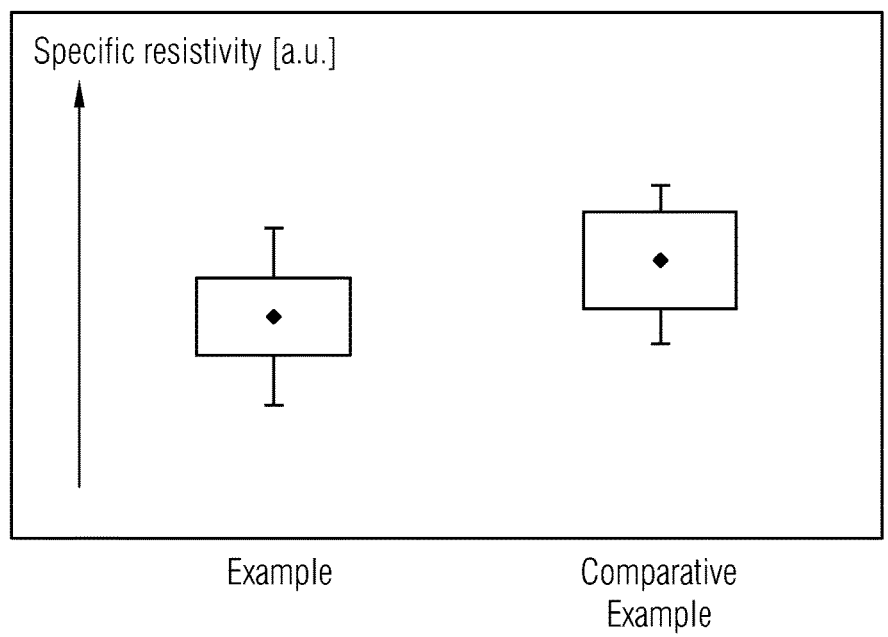
FIG. 2B is a graph illustrating the specific resistivity of the example and the comparative example.

FIGS. 2A and 2B illustrate properties of a porous metallization layer having a homogeneous porosity (comparative example) compared with a device comprising a metallization layer according to the embodiment of FIG. 1A (example). As is shown in FIG. 2A, the example has a slightly smaller degree of porosity than the comparative example. In this respect it is to be noted that FIG. 2A does not show the distribution of the porosity but merely shows a mean value of the porosity with respect to the metallization layer. FIG. 2B shows that the example has a smaller resistivity or specific resistance than the comparative example. Accordingly, the special porosity of the metallization layer results in a reduced resistivity. For example, a reduction of porosity of 7 to 8% may result in a reduction of the resistivity of 15 to 20%.

As will be discussed in the following, a degree of porosity which is higher in a portion adjacent to the base element than in a portion remote from the base element may be obtained by modifying the surface of a porous layer.

Figure 3:
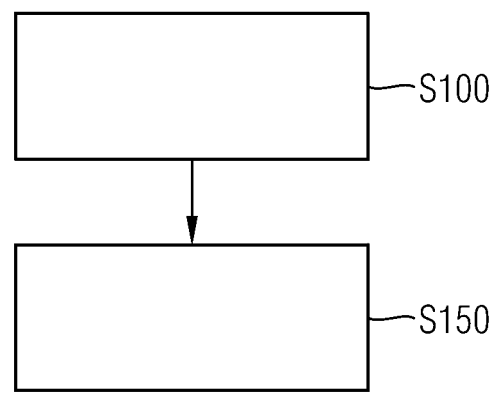
FIG. 3 illustrates a method of manufacturing a device according to an embodiment.

FIG. 3 illustrates a method of manufacturing a device. The method comprises forming a porous metallization layer over a base element 100 (S100). Thereafter, the porous metallization layer is modified (S150), so that the metallization layer has a varying degree of porosity, the degree of porosity being higher in a portion adjacent to the base element 100 than in a portion remote from the base element 100.

FIG. 4A illustrates a method of manufacturing a device according to a more specific embodiment. As is shown, the method comprises forming a porous metallization layer over a base element 100 (S100). Thereafter, a conductive filling material is formed over the porous metallization layer (S200) and a heat treatment is performed (S300). For example, the heat treatment may be performed for approximately 15 to 180 min at approximately 200 to 400° C. in an inert or reductive atmosphere. Due to the heat treatment the conductive filling material over the porous metallization layer and the porous metallization layer melt resulting in a decreased degree of porosity. For example, the device may be a semiconductor device, for example, a power semiconductor device.

According to an embodiment, forming the porous metallization layer may comprise performing a plasma dust deposition method or applying a metal paste over the base element, optionally followed by a heat treatment. For example, such a heat treatment may be performed in a reductive atmosphere, so that e.g. metal oxide may be reduced. Moreover, the heat treatment may result in a recrystallization which leads to a reduced resistivity and stress. The materials of the porous metallization layer and the conductive filling material may be the materials described above with reference to FIGS. 1A and 1B. For example, the material of the porous metallization layer may be copper. According to a further embodiment, the material of the porous metallization layer may be silver, nickel or gold or an alloy of copper, silver, nickel or gold. Then, the conductive filling material is formed over the porous metallization layer 160, 165. The metallization layer 160, 165 may be an open-porous layer or may not be an open-porous layer.

For example, forming the conductive filling material may comprise applying a layer or an ink including nanoparticles of the conductive filling material. In more detail, the system including the nanoparticles may comprise a powder, a paste or an ink which may be applied by suitable methods such as screen printing, stencil printing, ink jet printing, dipping or spinning. Accordingly, the nanoparticles may be applied at a large scale or only locally. According to an embodiment, the nanoparticles may have a diameter of 10 to 50 nm. For example, the nanoparticles may be applied so as to form a layer that levels out surface roughness or unevenness at the surface of the porous metallization layer. According to an embodiment, the thickness of the layer of the conductive filling material may by approximately 100 nm to even 20 μm or more than 50 μm, e.g. 100 μm. When applying a heat treatment, the nanoparticles may melt and/or sinter together with the grains of the porous layer and thus increase the density of the metallization layer by filling up the pores completely or at least partly.

This process is further illustrated in FIG. 4B. The porous metallization layer is formed as a continuous metallization layer 171 including grains 170 and grain boundaries 190. Pores 175 may be disposed between the some of the grains 170. An ink including nanoparticles 185 is applied as the conductive filling material so that the nanoparticles 185 are disposed in the pores 175. During the heat treatment, the nanoparticles 185 melt or sinter together with the grains 170 thereby forming larger grains 170 and shifting the grain boundaries 190. As a consequence, the pore size is reduced or the pores are even filled completely, resulting in an increased density of the metallization layer.

According to a further example, several layers of the conductive filling material may be applied and subjected to a heat treatment to result in a larger layer thickness without cracks.

According to a further example, the conductive filling material 180 may fill the pores without melting or forming an alloy with the grains 170. For example, if carbon, e.g. carbon nanotubes or nanowires or graphene is used as the conductive filling material 180, carbon may fill the pores 175 resulting in a decreased degree of porosity of the metallization layer. Due to the heat treatment, the solvent of the ink including the carbon may be evaporated.

When applying an ink including the nanoparticles 185, a temperature of the ambient may be selected so that the ink including the nanoparticle penetrates into the porous metallization layer to a predetermined depth. For example, the ink may comprise a solvent and the evaporation rate of the solvent depends from the temperature. At high temperatures, the solvent evaporates at a high rate so that the nanoparticles penetrate only to a small depth compared with a case in which the temperature is reduced, e.g. room temperature, at which the solvent evaporates at a very slow rate so that the nanoparticles penetrate to a greater depth. According to a further embodiment, a viscosity of the ink may be selected so that the conductive filling material penetrates into the porous metallization layer to a predetermined depth. For example, the higher the viscosity, the smaller the penetration depth.

As has been described above, according to the present method of manufacturing a device, a porous metallization layer may be modified after formation by applying metallic nanoparticles, whereby the pores 175 in the porous metallization layer may be partially or completely filled with the nanoparticles. Thereby, the properties, in particular, the physical properties of the metallization layer may be modified. For example, the metallization layer may be locally modified, e.g. by capping at the surface or forming a gradient of porosity. According to a further embodiment, nanoparticles of a metal which is different from the material of the metallization layer may be applied so that an intermetallic compound, an alloy or a composite system may be formed.

EXAMPLE 1

Starting material is a porous copper layer on an arbitrary carrier, e.g. a semiconductor wafer printed with a copper paste. The copper paste has been dried, sintered and annealed. This system defines a mechanical stable porous system. Thereafter, a copper nanoparticle ink may be applied, such as CI-002 (made by Intrinsiq Materials Inc.) using an inkjet printing process. For example, one layer of nanoparticles may be applied at a printing resolution of 495 dpi ("dots per inch"). The substrate temperature may be 35° C. and the following parameters may be set. Print head: 2/6/2 waveform (piezo); 87.2 V; 90%; −20 mbar; 30° C. head temperature; 35° C. substrate temperature. Thereafter, the metallization layer is dried at 100° C. for 15 minutes. Then, a sintering process is performed at 400° C., using 30 min. pre-heating time and 15 min. heating time at 400° C. at a $N_2/CH_2O_2$-atmosphere.

It has been shown that the applied nanoparticles are fused together or coalesced with the copper phase or copper material of the metallization layer. The formed metallization layer allows for an improved electrical and thermal conductivity in comparison to a copper layer having a homogeneous degree of porosity, on which no nanoparticle layers have been formed and no sintering process has been performed.

According to embodiments, the nanoparticles have a size of approximately 10 to 50 nm at a maximum of the distribution of approximately 20 nm. The size of the pores is about 100 to 10000 times the size of the nanoparticles. The size of the particles for forming the porous metallization layer is about 10 to 100 times the size of the nanoparticles. In a case in which the nanoparticles are made of a metal different from the metal of the porous metallization layer, an alloy may be formed when the subsequent heat treatment is performed. For example, such a heat treatment may be performed at a temperature of about 200° C. Since the porous layer has a high surface area, the formation of an alloy may be performed at a temperature below the melting point due to intrinsic properties of nanoparticles.

Due to the heat treatment of the metallization layer, the grain size of the metal of the substrate is increased.

According to a further embodiment, a varying degree of porosity may be achieved by applying at least two sub-layers having a different degree of porosity, respectively. For example, this may be accomplished by applying a first metal paste over the base element, and, thereafter, applying a second metal paste, wherein the second metal paste is formed to a second sub-layer (metal layer) having a lower degree of porosity than the first sub-layer which is formed of the first metal paste.

Generally, metal pastes for forming a porous metal may comprise mixtures of microparticles having a size of larger than 1 µm, e.g. having a size in a range of 1 to 10 µm, for example, 3 to 5 µm, with nanoparticles having a size of approximately 10 to 100 nm, e.g. 40 to 60 nm. When such a metal paste is heated, a sintering process of merging the microparticles may take place at temperatures which are lower than the melting point of the metal used. For example, in case of copper metal pastes, a heat treatment may be performed at a temperature of 200 to 250° C., whereas the melting point of copper is 1084° C.

By changing the composition ratio of the nanoparticles with respect to the microparticles, the porosity of the metal layer formed by annealing (sintering) may be determined. For example, if a larger ratio of nanoparticles with respect to microparticles is contained in the metal paste, the resulting metal layer will have a larger density and, thus, a lower degree of porosity. On the other side, if a metal paste having a lower ratio of nanoparticles with respect to the microparticles is used, a metallization layer having a lower density and, thus, a higher degree of porosity will be formed.

According to a further embodiment, the porosity of the metal layer formed by annealing (sintering) may be determined by appropriately setting the pore size distribution of the microparticles of the metal paste.

Forming the first sub-layer may comprise applying a first metal paste, e.g. by printing, on a base element, drying and performing an sintering and annealing step for forming the porous metallization layer. Due to the higher degree of porosity, a lower stress is present at the interface to the base element. After drying and annealing/curing the first sub-layer, a second sub-layer is formed, wherein the second layer has a lower degree of porosity. The metal paste for forming the second sub-layer is printed, dried and annealed. The second sub-layer has a larger degree of thermal stress due to the lower degree of porosity. However, due to the first sub-layer that is disposed between the second sub-layer and the base element, the stress to the base element is significantly reduced. The second layer increases the electrical conductivity of the whole metallization and has a higher degree of hardness, thereby improving further processing methods such as mechanical bonding. At the interface between the first and the second sub-layer, a transition layer is formed in which the metal paste for forming the second sub-layer penetrates into the first sub-layer and forms a compound.

Accordingly, when forming a first sub-layer having a high degree of porosity followed by a process of forming a second sub-layer having a lower degree of porosity, it is possible to optimise the physical properties of the complete layer stack. So the high porous layer at the interface to the carrier 100 provides low stress to the carrier 100 and the low porous layer at the top of the layer stack provides increased hardness for bonding at the surface. The second sub-layer may be formed of a metal paste comprising a metal which is different from the metal of the first sub-layer. As is clearly to be understood, more than two porous sub-layers may be formed over the base element.

Further properties of the resulting metallization layer may be changed by changing the physical properties of the sub-layers, by adjusting the thickness of the first sub-layer and of the second sub-layer as well as the thickness of the entire metallization layer. Further, the number of sub-layers may be changed as well as the chemical composition of the sub-layers.

According to a further embodiment, the metallization layer may comprise three sub-layers. For example, the first sub-layer may have a large degree of porosity, followed by a second sub-layer having a lower degree of porosity. Further, a third sub-layer having a higher degree of porosity than the second sub-layer may be formed on top of the second sub-layer. For example, this may be provide a reduced stress to a further system that is to be disposed on the third sub-layer.

In other words, according to further embodiments additional sub-layers may be disposed over the second sub-layer, the additional sub-layers having a varying degree of porosity which may be selected in accordance with the requirements of the overall system.

The surface of the first sub-layer may be open-porous or may not be open-porous before forming the second sub-layer.

EXAMPLE 2

Starting material is an arbitrary carrier. For example, the carrier may be a semiconductor wafer comprising several device components 555, and, optionally, circuit elements 550 (cf. FIG. 5) as has been discussed above with reference to FIG. 1. For example, a barrier layer may be formed over the first surface 510 of the carrier 500. For example, if the semiconductor material is silicon, an unwanted chemical reaction between the silicon and the copper layer may be avoided due to the barrier layer. Thereafter, a first copper paste is applied to the carrier 500. For example, this may be accomplished by performing a stencil or a screen printing method, followed by a drying step (e.g. at 60° C. for 1 hour, depending on the paste properties) and further steps of sintering and annealing. As a result, a mechanical stabile porous system having a porosity of approximately 40 to 50% and a layer thickness of 10 to 50 µm may be obtained, depending on paste and stencil thickness. As is to be clearly understood, the first sub-layer may formed by any other suitable method.

Thereafter, for forming the second sub-layer, a further copper paste may be applied so as to result into a porosity of approximately 15 to 25%. For example, this may be accomplished by applying a nano paste comprising nanoparticles without microparticles or a significant lower fraction of micro particles and having a solid content of 50 to 90%, using a stencil printing process. Thereafter, a drying step at 60° C. for 1 hour and further an annealing step at approximately 400° C. is performed. The drying and annealing steps may be performed in a similar manner as the method for forming the first sub-layer. For example, the second sub-layer may have a thickness which is smaller than the thickness of the first sub-layer. For example, a thickness of the second sub-layer may be 1 to 10 µm.

Figure 5:
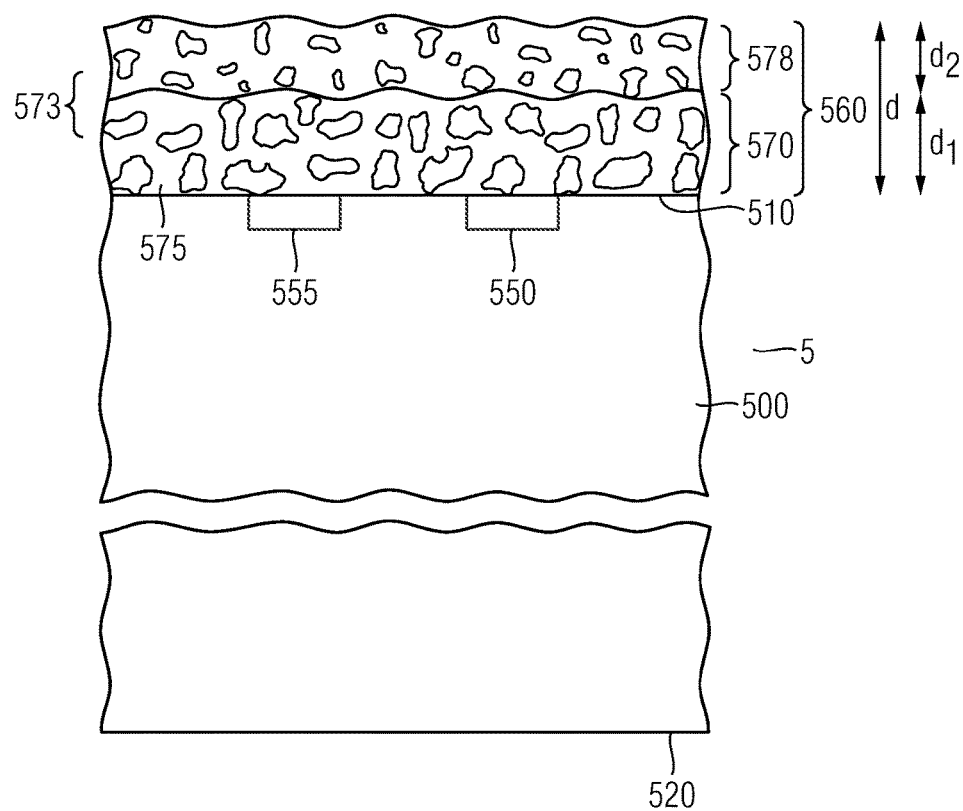
FIG. 5 shows a cross-sectional view of a device according to a further embodiment.

FIG. 5 shows an example of a resulting structure. As is shown, the metallization layer 560 comprises a first sub-layer 570 and a second sub-layer 578. The second sub-layer 578 has a lower degree of porosity than the first sub-layer. The thickness d of the metallization layer 560 may be approximately 10 to 500 µm. The thickness $d_1$ of the first metallization layer 570 may be 10 to 490 µm, and the thickness of the second metallization layer 578 may be approximately 1 to 50 µm. According to a specific embodiment, the thickness di of the first metallization layer 570 may be 10 to 50 µm, and the thickness of the second metallization layer 578 may be approximately 1 to 10 µm. According to this embodiment, the thickness of the metallization layer 560 may be 10 to 60 µm. A transition layer 573 is formed at the interface between the first porous layer 570 and the second porous layer 578. It is to be noted that due to the porosity of the layers the thickness d of the metallization layer 560 may be different from the thickness of the first metallization layer 570 and the second metallization layer 578.

Figure 6A:
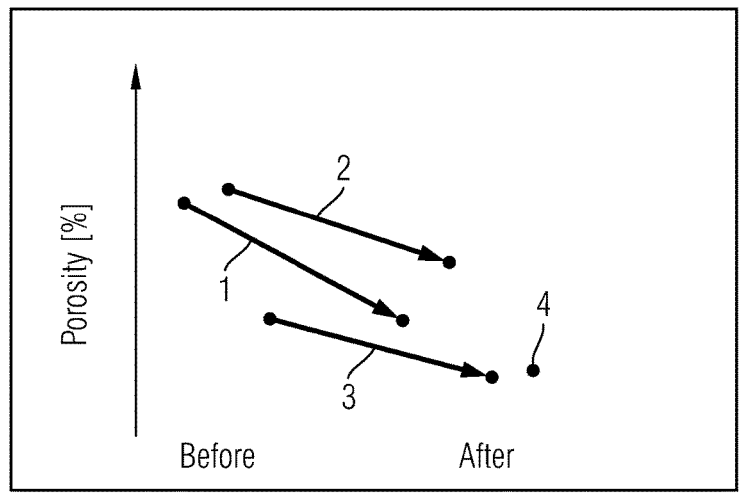
FIG. 6A is a graph illustrating the porosity of examples.

FIG. 6A shows a schematic diagram illustrating the specific resistivity of the entire or combined metal layer before and after forming the second sub-layer. The graphs (1) to (3) illustrate the behavior of the specific resistivity of three single sub-layers each having a different degree of porosity. To be more specific, as is illustrated in FIG. 6A, sub-layer (2) has a larger degree of porosity than sub-layer (1) which has a larger degree of porosity than sub-layer (3). After applying a nanoparticle paste on top and performing a curing step to form a second sub-layer (4), the average porosity of all three metallization layers decreases. In particular, the porosity of the metallization layer comprising sub-layer (3) decreases to a degree corresponding to the porosity of the second sub-layer which is formed of the metal paste (4).

Figure 6B:
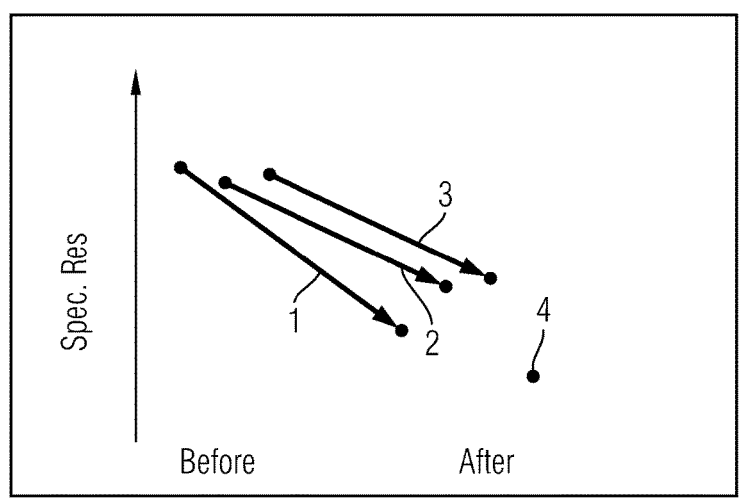
FIG. 6B is a graph illustrating the resistivity of examples.

FIG. 6B illustrates the behavior of the specific resistance after forming the second layer and performing a curing step. The specific resistance has been measured using a 4-point measurement configuration. As is illustrated, the specific resistance of a metal layer comprising any of metal layers (1), (2), (3) largely decreases after forming the second metal layer of metal paste (4). Further, it has been shown, that due to the formation of the second layer, the mechanical stress when applying different temperatures may be largely decreased, compared to a layer, which has the same over all porosity and specific conductivity derived from only one homogeneous layer/one paste of the same thickness.

Figure 7:
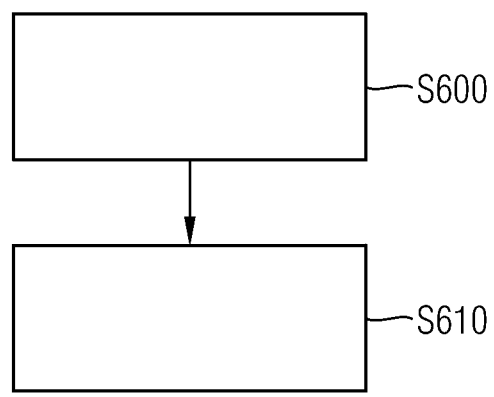
FIG. 7 illustrates a method of forming a metallization layer according to a further embodiment.

FIG. 7 summarizes a method of forming a metallization layer according to this embodiment. According to this embodiment, modifying the porous metallization layer comprises forming a second sub-layer over the porous layer, the second sub-layer 578 having a lower degree of porosity than the porous layer 570. Accordingly, forming the metallization layer comprises forming a first sub-layer (S600) over the base element and, thereafter, forming a second sub-layer (S610) over the first sub-layer, the second sub-layer having a lower degree of porosity than the first sub-layer. For example, this may comprise applying a first metal paste and, thereafter, applying a second metal paste over the first metal paste, the second metal paste having a higher amount of nanoparticles than the first metal paste.

The second metal paste may contain a metal which may be the same or different from the metal of the first metal paste.

According to a further embodiment, the physical properties of the porous metal layer may be modified by applying a metal organic precursor compound. Thereafter, the metal organic precursor material may be converted into a metal. For example, this may be accomplished by an appropriate thermal treatment. Additionally or alternatively, this may be accomplished by using specific physical and chemical conditions that are appropriate for the selected precursor. For example, the precursor compound may be an inorganic metal compound. According to a further embodiment, the precursor compound may be a metal organic compound. In any of these cases the metal may be equal to the metal of the metallization layer or a different metal. For example, the metal of the precursor material may be a metal which forms an alloy with copper. Specific examples may be selected from the group of tin, zinc, nickel, indium, gold and silver. The precursor compound may be applied as a solution or as a liquid, e.g., as a molten precursor or may be applied as a gas. For example, when the precursor compound is applied as a liquid precursor compound, this may be accomplished using an ink jet printing method, a spinning method, a spraying method, dipping method or any other suitable method for applying a liquid. The precursor compound penetrates into the pores of the metal layer. Optionally, a drying process and a heat treatment may be performed so that the precursor compound is converted into a metal phase or reacts so as to locally fill the pores and change the properties of the system. Due to this treatment, the properties of the layer may be modified. For example, the porosity of the metal layer may be reduced. The precursor compound may be applied over the whole surface of the metal layer or only at portions thereof. For example, portions of the surface of the metal layer may be covered so that at these covered portions no compound is applied or a gradient of the concentration of the precursor compound may be applied so as to result into a gradient of the porosity.

The reaction of the precursor compound may be induced by energy. For example, the energy may be applied as thermal energy, e.g., in a heating process, or may be applied as photon energy, e.g., by using laser irradiation or irradiation by other light sources, high energy discharging (Xe-flash lamps) or microwave excitation. For example, this reaction is performed in an atmosphere which may be inert (e.g. $N_2$, He, Ar) or in an atmosphere of a reaction partner such as $H_2$, formic acid and others whereby an oxidation may be prevented or a generated metal oxide may be reduced.

Unwanted products of the reaction of the precursor may be gaseous and may exit the metallization layer via the pores.

Optionally, thereafter, a thermal annealing step may be performed in order to obtain a stabile system which has undergone recrystallization.

Generally, the electrical characteristics of the metallization layer may be influenced by the following parameters:

Characteristics of the base element, the chemical composition of the precursor compound (e.g. especially, if different metals are used which may form an intermetallic phase with the metal layer), the boiling temperature of the solvent and the concentration of the precursor, the method of applying the precursor compound and the amount of applied precursor material.

A further parameter which may change the properties of the metallization layer is the temperature of the base element when the precursor material is applied. For example, if the base element is held at a high temperature, due to the evaporation of the solvent, the precursor compound does not penetrate into a deep depth and forms a surface capping layer. At lower temperatures, the solution may penetrate to a deeper depth into the metallization layer and may form a gradient of concentration of the precursor compound. As a result, the porosity of the system is varied at a larger scale.

EXAMPLE 3

Starting point for performing the method according to this embodiment is a base element similar to the base element described with reference to Example 2. First, a metal paste (e.g. CP-003 by Intrinsiq Materials Inc.) for forming a metal layer having a high degree of porosity is applied. This may be accomplished using a paste printing method (stencil or screen print). Then, a drying process and an annealing step may be performed so as to form a mechanical stabile porous system having a porosity of approximately 40-50%. The process parameters may be as described with reference to Example 1. The metal layer may have a thickness of approximately 10 to 50 μm. Thereafter, a metal organic copper precursor compound may be applied.

According to an example, a copper oximate may be used. A heat treatment to a temperature sufficient to decompose the copper oximate may be performed. For example, the base element may be heated to a temperature of approximately 180° C. As a result, CuO is formed of the copper oximate. Thereafter, a reduction process may be performed so as to reduce the CuO to Cu. For example, this may be accomplished in an inert atmosphere which may contain formic acid or another reducing agent such as methanol, formaldehyde, carbon monoxide, hydrogen ($H_2$) at a temperature which may be higher than 200° C.

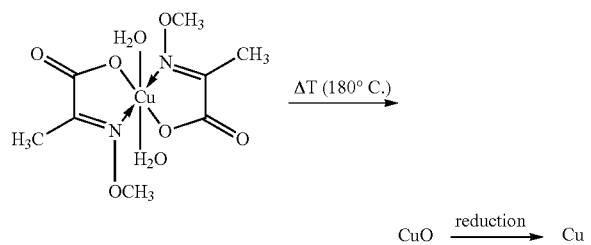

According to a further embodiment, copper formate may be used as the precursor compound.

Thereafter, a heat treatment is performed so as to decompose the copper formate to copper. For example, the temperature may be approximately 200° C. An advantage of using copper formate is that no additional reducing agent is required since it is formed by the thermal. decomposition of the copper formate insitu and an inert atmosphere is sufficient.

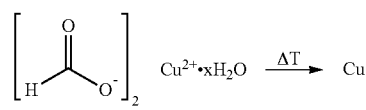

According to a further implementation, a copper propoxide may be used. For example, a copper amino propoxide may have the general formula:

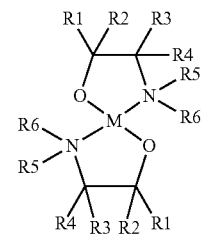

M=metal (Cu, Ni, Zn, Sn, . . . )

For example, R1 to R6 R may be a methyl or ethyl group or a further residue such as H, an alkyl or an aryl group. The groups may be the same group or residue or may be different from each other.

For example, if the metal M is copper and R1 is a methyl group, R2, R3, R4 are hydrogen and R5 and R6 are a methyl group, respectively, the compound is a copper (II) bis (dimethylamino-2-propoxide) (Cu-DMAP). Alternatively, in case R5 and R6 are an ethyl group, respectively, this may be copper (II) bis (diethylamino-2-propoxide) (Cu-DEAP). After applying any of these precursor materials a heat treatment may be performed for decomposing the compound into Cu. For example, during the heat treatment the temperature may be approximately 140-150° C. For example, the thermal decomposition may be performed in an inert gas atmosphere ($N_2$, noble gas), in forming gas, under a $N_2$/formic acid atmosphere or under an other $N_2$/reducing agent atmosphere.

For example, a saturated solution is produced and is applied using spinning, dipping, spraying, inkjet printing or a pipette. Alternatively, the precursor material may be molten and applied. For example, Cu-DEAP or CU-DMAP has a melting point of ca. 50° C. After a drying step, e.g., at 60° C. for 30 min, a heating process is performed to approximately 150-400° C., e.g., heating-up time of 30 minutes, a holding time of 15-90 minutes at 400° C. in an $N_2$/formic acid gas stream to convert the precursor into metallic Cu.

The following table shows the influence of the precursor compound using different application methods as well as the improvement of the electrical conductivity of the layer.

| Application Method | | Improvement of the resistivity of the layer |
| --- | --- | --- |
| Cu-DMAP | directly as molten material (Hotplate, 80° C.) | 6% |
| Cu-DMAP | saturated solution in 2-Butanol | 6% |
| Cu-DEAP | directly as molten material (Hotplate, 80° C.) | 9% |
| Cu-DEAP | solution in 2-Methyl-1-propanol | 9% |
| Cu-Formate | saturated solution in $H_2O$ | 30% |
| Cu-Formate | saturated solution in ethylene glycol | 30% |

As has been shown in the table above, due to applying the metal precursor layer over the metallization layer, the electrical conductivity of the entire layer may be improved.

Figure 8:
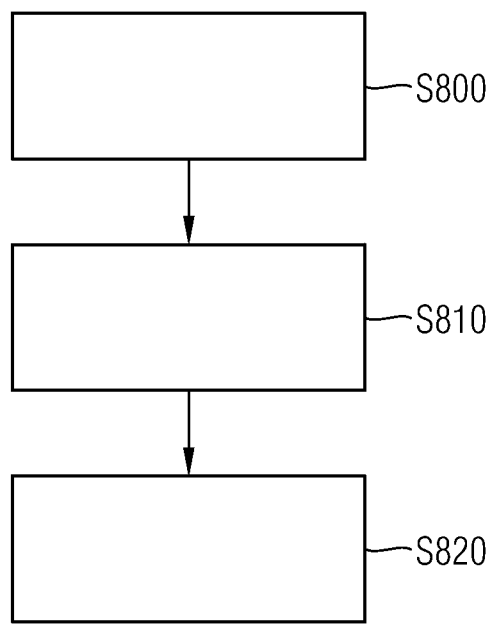
FIG. 8 illustrates a method of forming a metallization layer according to a further embodiment.

FIG. 8 summarizes a method according to this embodiment. As is illustrated in FIG. 8, a method of manufacturing a device comprises forming (S800) a porous metallization layer over a base element, thereafter, applying (S810) a precursor material to the porous metallization layer, and then performing (S820) a heat treatment process.

While embodiments of the invention have been described above, those of ordinary skill will appreciate that further embodiments may be implemented. For example, further embodiments may comprise any sub-combination of features recited in the claims or any sub-combination of elements described in the examples given above. Accordingly, this spirit and scope of the appended claims should not be limited to the description of the embodiments contained herein.

What is claimed is:

1. A device, comprising:
   a semiconductor substrate including a device component; and
   a porous metallization layer over the semiconductor substrate and electrically coupled to the device component, the metallization layer comprising a metal from the group of copper, silver, nickel and gold, further comprising a conductive filling material, wherein a ratio of the conductive filling material with respect to the metal is higher at a portion remote from the semiconductor substrate than at a portion adjacent to the semiconductor substrate.

2. The device according to claim 1, wherein the conductive filling material comprises at least one material selected from the group of copper, silver, zinc, tin, gold, indium or nickel or carbon.

3. The device according to claim 1, wherein a thickness of the metallization layer is between 5 µm and 250 µm.

4. The device according to claim 1, wherein a diameter of the pores is 200 nm to 50 µm.

5. The device according to claim 1, wherein the conductive filling material at least partially fills at least a portion of the pores.

6. The device according to claim 1, wherein the ratio of the conductive filling material with respect to the metal of the porous metallization layer gradually increases from a portion adjacent to the base element to a portion remote from the base element.

7. A method of manufacturing a device, comprising:
   forming a porous metallization layer over a base element, and thereafter, modifying the porous metallization layer, so that the metallization layer has a varying degree of porosity, the degree of porosity being higher in a portion adjacent to the base element than in a portion remote from the base element, wherein a resistivity of the porous metallization layer is reduced due to modifying the degree porosity.

8. The method according to claim 7, wherein modifying the porous metallization layer comprises forming a conductive filling material over the porous metallization layer, and performing a heat treatment.

9. The method according to claim 8, wherein forming the conductive filling material comprises applying an ink including nanoparticles of the conductive filling material.

10. The method according to claim 9, wherein a temperature while applying the ink is selected so that the conductive filling material penetrates into the porous metallization layer to a predetermined depth.

11. The method according to claim 9, wherein a viscosity of the ink is selected so that the conductive filling material penetrates into the porous metallization layer to a predetermined depth.

12. The method according to claim 8, wherein forming the conductive filling material comprises applying a layer including nanoparticles of the conductive filling material, the nanoparticles having a diameter of 5 to 100 nm.

13. The method of claim 8, wherein the porous metallization layer comprises pores having a diameter of 200 nm to 50 µm.

14. The method according to claim 7, wherein the porous metallization layer contains at least 90 vol.-% [v/v] copper, silver, gold or nickel.

15. The method according to claim 7, wherein forming the porous metallization layer comprises performing a plasma dust deposition method or applying a copper paste over the base element, followed by a heat treatment.

16. The method according to claim 7, wherein modifying the porous metallization layer comprises applying a precursor material to the porous metallization layer and converting the precursor material into a metal.

17. The method according to claim 16, wherein the precursor material is an inorganic metal compound or a metal organic compound.

18. The method according to claim 17, wherein the porous metallization layer comprises copper or silver or nickel or gold and the metal of the precursor material is selected from the group of copper, tin, zinc, gold, nickel, indium and silver.

19. The method according to claim 7, wherein modifying the porous metallization layer comprises forming a second sub-layer over the porous layer, the second sub-layer having a degree of porosity that is different from the degree of porosity of the porous layer.

20. The method according to claim 19, wherein forming the porous layer and forming the second sub-layer comprises applying a first metal paste over the base element and, thereafter, applying a second metal paste, the second metal paste resulting in a different porosity than the first metal paste.

21. The method according to claim 19, wherein forming the porous layer and forming the second sub-layer comprises applying a first metal paste over the base element and, thereafter, applying a second metal paste, the second metal paste containing at least one metal that is different from any material of the first metal paste.

* * * * *